(12) United States Patent
Campbell et al.

(10) Patent No.: US 8,018,720 B2
(45) Date of Patent: Sep. 13, 2011

(54) CONDENSER STRUCTURES WITH FIN CAVITIES FACILITATING VAPOR CONDENSATION COOLING OF COOLANT

(75) Inventors: Levi A. Campbell, Poughkeepsie, NY (US); Richard C. Chu, Poughkeepsie, NY (US); Michael J. Ellsworth, Jr., Poughkeepsie, NY (US); Madhusudan K. Iyengar, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/491,287

(22) Filed: Jun. 25, 2009

(65) Prior Publication Data
US 2010/0328890 A1 Dec. 30, 2010

(51) Int. Cl.
*H05K 7/20* (2006.01)
*H01L 23/34* (2006.01)

(52) U.S. Cl. .............. 361/700; 361/679.47; 361/679.53; 361/679.54; 361/703; 361/704; 361/709; 361/710; 361/718; 165/104.33; 165/185; 165/908; 257/715

(58) Field of Classification Search .............. 361/679.52–679.54, 699–704, 361/707, 709–710, 714, 718, 719; 165/80.4–80.5, 165/104.33, 185, 908; 174/15.2; 62/259.2; 257/714–715, E23.085; 438/122
See application file for complete search history.

(56) References Cited

U.S. PATENT DOCUMENTS

| 2,643,282 | A | | 6/1953 | Greene |
|---|---|---|---|---|
| 2,942,165 | A | * | 6/1960 | Jackson et al. ............. 257/714 |
| 3,109,485 | A | | 11/1963 | Fortier |
| 3,222,580 | A | * | 12/1965 | Curll, Jr. .................. 257/722 |
| 3,616,533 | A | | 11/1971 | Heap et al. |
| 4,064,300 | A | | 12/1977 | Bhangu |
| 4,108,242 | A | | 8/1978 | Searight et al. |
| 4,201,195 | A | | 5/1980 | Sakhuja |
| 4,323,914 | A | | 4/1982 | Berndlmaier et al. |

(Continued)

FOREIGN PATENT DOCUMENTS
JP   8-254512 A   10/1996
(Continued)

OTHER PUBLICATIONS

Iyengar et al., "Apparatus and Method for Facilitating Cooling of an Electronics System", U.S. Appl. No. 11/957,619, filed Dec. 17, 2007.

(Continued)

*Primary Examiner* — Robert J Hoffberg
(74) *Attorney, Agent, or Firm* — Dennis Jung, Esq.; Kevin P. Radigan, Esq.; Heslin Rothenberg Farley & Mesiti P.C.

(57) ABSTRACT

Vapor condensers and cooling apparatuses are provided which facilitate vapor condensation cooling of a coolant employed in cooling an electronic device. The vapor condenser includes a thermally conductive base structure with a plurality of condenser fins extending from the base structure. The condenser fins have a proximal end coupled to the base structure and a remote end remote from the base structure. At least one exposed cavity is provided within each condenser fin extending from the remote end towards the proximal end. The exposed cavities are sized to provide greater condenser fin surface area for facilitating vapor condensate formation, and thereby facilitate cooling of an electronic device using a two-phase coolant.

10 Claims, 11 Drawing Sheets

U.S. PATENT DOCUMENTS

| | | | |
|---|---|---|---|
| 4,622,946 A | 11/1986 | Hurley et al. | |
| 4,750,086 A | 6/1988 | Mittal | |
| 4,833,567 A * | 5/1989 | Saaski et al. | 361/700 |
| 5,006,924 A | 4/1991 | Frankeny et al. | |
| 5,063,476 A | 11/1991 | Hamadah et al. | |
| 5,126,919 A | 6/1992 | Yamamoto et al. | |
| 5,168,919 A | 12/1992 | Berenholz et al. | |
| 5,183,104 A | 2/1993 | Novotny | |
| 5,220,804 A | 6/1993 | Tilton et al. | |
| 5,308,920 A | 5/1994 | Itoh | |
| 5,349,831 A | 9/1994 | Daikiku et al. | |
| 5,351,748 A * | 10/1994 | Dagan | 165/80.3 |
| 5,411,077 A | 5/1995 | Tousignant | |
| 5,508,884 A | 4/1996 | Brunet et al. | |
| 5,608,610 A | 3/1997 | Brzezinski | |
| 5,634,351 A | 6/1997 | Larson et al. | |
| 5,718,117 A | 2/1998 | McDunn et al. | |
| 5,720,338 A | 2/1998 | Larson et al. | |
| 5,726,495 A * | 3/1998 | Aihara et al. | 257/722 |
| 5,781,411 A * | 7/1998 | Feenstra | 361/704 |
| 5,854,092 A | 12/1998 | Root et al. | |
| 5,963,425 A | 10/1999 | Chrysler et al. | |
| 6,000,908 A | 12/1999 | Bunker | |
| 6,134,108 A | 10/2000 | Patel et al. | |
| 6,134,783 A * | 10/2000 | Bargman et al. | 29/890.03 |
| 6,193,905 B1 | 2/2001 | Yamada et al. | |
| 6,237,223 B1 | 5/2001 | McCullough | |
| 6,366,462 B1 | 4/2002 | Chu et al. | |
| 6,378,605 B1 | 4/2002 | Kutscher et al. | |
| 6,431,260 B1 | 8/2002 | Agonafer et al. | |
| 6,474,074 B2 | 11/2002 | Ghoshal | |
| 6,490,160 B2 | 12/2002 | Dibene et al. | |
| 6,519,151 B2 | 2/2003 | Chu et al. | |
| 6,549,408 B2 | 4/2003 | Berchowitz | |
| 6,550,263 B2 * | 4/2003 | Patel et al. | 62/259.2 |
| 6,550,531 B1 | 4/2003 | Searls et al. | |
| 6,571,569 B1 | 6/2003 | Rini et al. | |
| 6,817,196 B2 | 11/2004 | Malone et al. | |
| 6,817,405 B2 * | 11/2004 | Kamath et al. | 165/80.3 |
| 6,918,435 B2 * | 7/2005 | Dwyer | 165/171 |
| 6,926,071 B2 * | 8/2005 | Lee et al. | 165/80.3 |
| 6,938,678 B1 | 9/2005 | Bortolini et al. | |
| 6,938,680 B2 | 9/2005 | Garner et al. | |
| 6,992,888 B1 | 1/2006 | Iyer | |
| 7,077,189 B1 | 7/2006 | Reyzin et al. | |
| 7,079,393 B2 | 7/2006 | Colgan et al. | |
| 7,134,289 B2 | 11/2006 | Patel et al. | |
| 7,254,030 B2 | 8/2007 | Chiba et al. | |
| 7,284,389 B2 | 10/2007 | Sharma et al. | |
| 7,307,841 B2 | 12/2007 | Berlin et al. | |
| 7,349,213 B2 | 3/2008 | Campbell et al. | |
| 7,357,173 B2 * | 4/2008 | Griesmayer | 165/80.3 |
| 7,362,574 B2 | 4/2008 | Campbell et al. | |
| 7,365,981 B2 | 4/2008 | Myers et al. | |
| 7,369,410 B2 * | 5/2008 | Chen et al. | 361/701 |
| 7,375,962 B2 | 5/2008 | Campbell et al. | |
| 7,380,409 B2 | 6/2008 | Campbell et al. | |
| 7,450,385 B1 | 11/2008 | Campbell et al. | |
| 7,477,513 B1 | 1/2009 | Cader et al. | |
| 7,495,914 B2 | 2/2009 | Tilton et al. | |
| 7,522,422 B2 | 4/2009 | Chiba et al. | |
| 2001/0006101 A1 | 7/2001 | Chu et al. | |
| 2002/0062945 A1 | 5/2002 | Hocker et al. | |
| 2002/0118511 A1 | 8/2002 | Dujari et al. | |
| 2003/0205363 A1 | 11/2003 | Chu et al. | |
| 2004/0246683 A1 | 12/2004 | Honsberg-Riedl et al. | |
| 2006/0039111 A1 * | 2/2006 | Huang | 361/698 |
| 2006/0118280 A1 | 6/2006 | Liu | |
| 2006/0162365 A1 | 7/2006 | Hoang et al. | |
| 2006/0191675 A1 * | 8/2006 | Fletcher et al. | 165/172 |
| 2006/0196640 A1 | 9/2006 | Siu | |
| 2007/0133173 A1 | 6/2007 | Hsiung et al. | |
| 2007/0201210 A1 | 8/2007 | Chow et al. | |
| 2007/0258213 A1 | 11/2007 | Chen et al. | |
| 2008/0002363 A1 | 1/2008 | Campbell et al. | |
| 2008/0225478 A1 | 9/2008 | Goettert et al. | |
| 2009/0284918 A1 * | 11/2009 | Chou | 361/695 |
| 2009/0284927 A1 * | 11/2009 | Li et al. | 361/704 |

FOREIGN PATENT DOCUMENTS

| | | | |
|---|---|---|---|
| JP | 09116056 A | * | 5/1997 |
| JP | 2002026201 A | * | 1/2002 |
| TW | 319406 | * | 11/1997 |

OTHER PUBLICATIONS

Chu et al., "Energy Efficient Apparatus and Method for Cooling and Electronics Rack", U.S. Appl. No. 12/108,020, filed Apr. 23, 2008.

Campbell et al., "Suspended Integrated Manifold System with Serviceability for Large Planar Arrays of Electronic Modules", IBM Technical Disclosure, IP.com, IP.com No. IPCOM000126455D (Jul. 18, 2005).

Campbell et al., "Liquid Cooling Apparatus and Method of Facilitating Cooling of an Electronic System", U.S. Appl. No. 12/168,259, filed Jul. 7, 2008.

Ellsworth, Jr., et al., "System and Method for Facilitating Cooling of a Liquid-Cooled Electronics Rack", U.S. Appl. No. 11/942,207, filed Nov. 19, 2007.

Campbell et al., "Hybrid Air and Liquid Coolant Conditioning Unit for Facilitating Cooling of One or More Electronics Racks of a Dada Center", U.S. Appl. No. 11/944,680, filed Nov. 26, 2007.

Campbell et al., "Method and Apparatus for Defect Detection in a Cold Plate", U.S. Appl. No. 12/053,762, filed Mar. 24, 2008.

Campbell et al., "Cooling Apparatus and Method of Fabrication Thereof with Jet Impingement Structure Integrally Formed on Thermally Conductive Pin Fins", U.S. Appl. No. 12/141,290, filed Jun. 18, 2008.

Campbell et al., "Cooling Apparatus and Method of Fabrication Thereof with a Cold Plate Formed In Situ on a Surface to be Cooled", U.S. Appl. No. 12/143,289, filed Jun. 20, 2008.

Campbell et al., "Apparatus and Method for Facilitating Pumped Immersion-Cooling of an Electronic Subsystem", U.S. Appl. No. 12/256,628, filed Oct. 23, 2008.

Notice of Allowance for U.S. Appl. No. 12/491,289, dated Aug. 27, 2010.

Office Action for U.S. Appl. No. 12/491,281, dated Oct. 7, 2010.

Chee, B., "Supermicro Water Cooled Blades", Info World, Geeks in Paradise, (Mar. 5, 2008), http://weblog.infoworld.com/geeks/archives/2008/03.

Office Action for U.S. Appl. No. 12/491,293 (U.S. Patent Publication No. 2010/0328891 A1), dated Mar. 13, 2011.

* cited by examiner

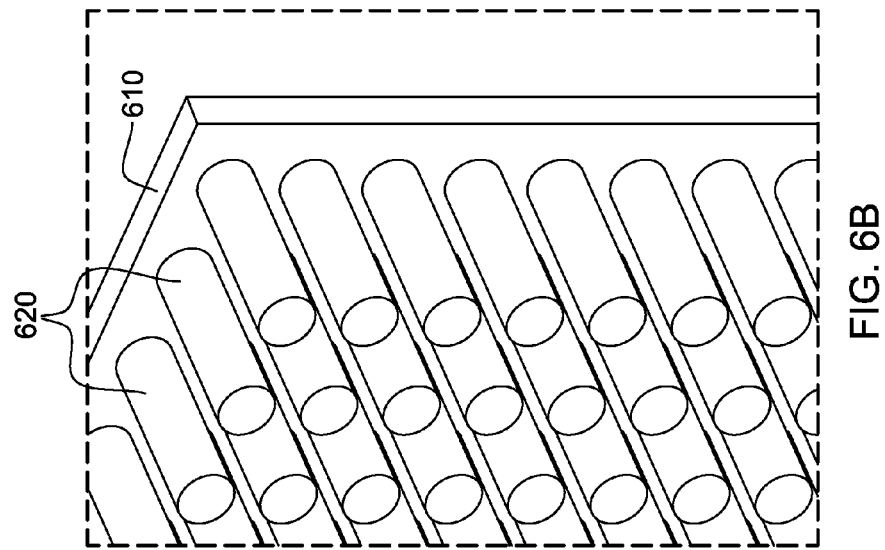
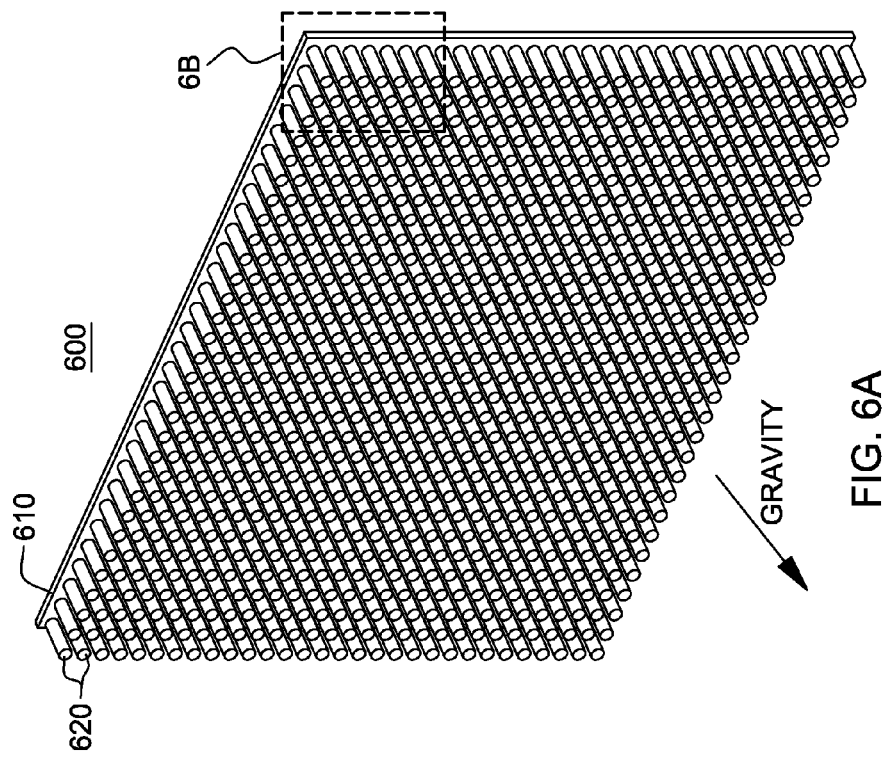

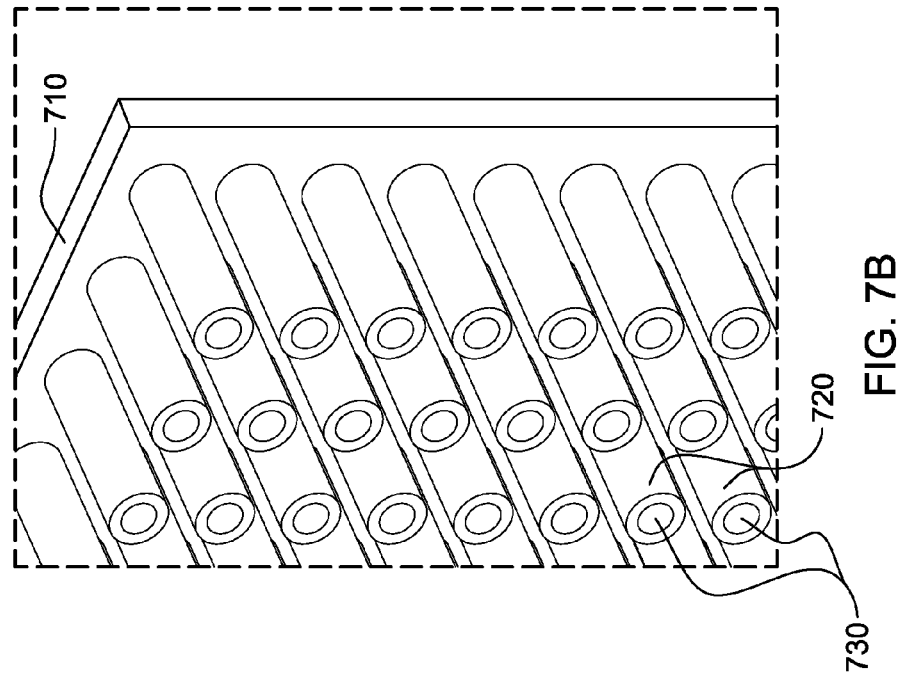
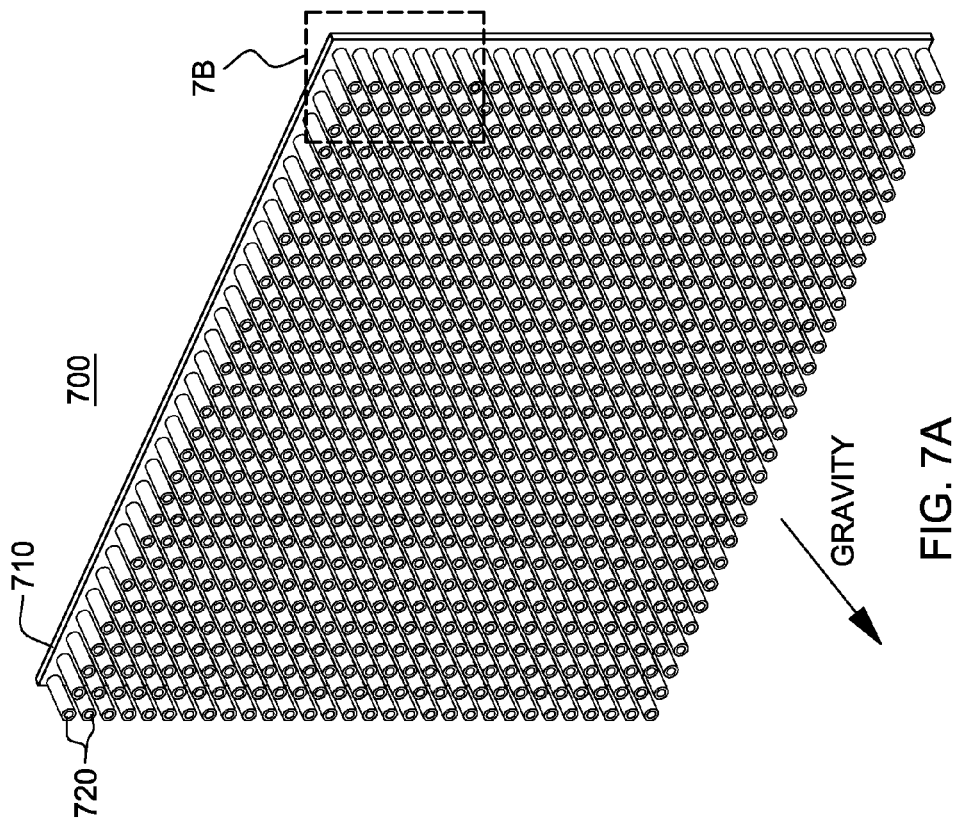
FIG. 7B
FIG. 7A

CONDENSER STRUCTURES WITH FIN CAVITIES FACILITATING VAPOR CONDENSATION COOLING OF COOLANT

TECHNICAL FIELD

The present invention relates to heat transfer mechanisms, and more particularly, to cooling apparatuses, cooled electronic modules and methods of fabrication thereof for removing heat generated by one or more electronic devices. Still more particularly, the present invention relates to vapor condenser structures configured with cavities to enhance vapor condensation cooling of coolant employed in a cooling apparatus for cooling an electronic module, an electronic subsystem or electronics rack, such as for use in a cooled electronic module with pump-enhanced, dielectric fluid immersion-cooling of one or more heat-generating electronic devices.

BACKGROUND OF THE INVENTION

As is known, operating electronic devices produce heat. This heat should be removed from the devices in order to maintain device junction temperatures within desirable limits, with failure to remove heat effectively resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

The need to cool current and future high heat load, high heat flux electronic devices therefore mandates the development of aggressive thermal management techniques, using liquid cooling. Various types of liquid coolants provide different cooling capabilities. For example, fluids such as refrigerants or other dielectric liquids (e.g., fluorocarbon liquid) exhibit lower thermal conductivity and specific heat properties compared to liquids such as water or other aqueous fluids. Dielectric liquids have an advantage, however, in that they may be placed in direct physical contact with electronic devices and their interconnects without adverse affects, such as corrosion or electrical short circuits. Other cooling liquids, such as water or other aqueous fluids, exhibit superior thermal conductivity and specific heat compared with dielectric fluids. Water-based coolants, however, must be kept from physical contact with electronic devices and interconnects, since corrosion and electrical short circuit problems are otherwise likely to result.

SUMMARY OF THE INVENTION

In one aspect, the shortcomings of the prior art are overcome and additional advantages are provided through the provision of a vapor condenser for facilitating cooling of an electronic device. The vapor condenser includes a thermally conductive base structure and at least one thermally conductive condenser fin extending from the thermally conductive base structure. The at least one thermally conductive condenser fin has a proximal end coupled to the thermally conductive base structure and a remote end remote from the thermally conductive base structure, and at least one exposed cavity formed therein extending from the remote end towards the proximal end thereof. The at least one exposed cavity is sized to provide an enhanced condenser fin surface area for facilitating coolant vapor condensate formation, thereby facilitating cooling of the electronic device using a two-phase coolant.

In a further aspect, a cooling apparatus is provided which includes a housing configured to at least partially surround and form a sealed compartment about an electronic device to be cooled, and dielectric fluid disposed within the sealed compartment. The electronic device to be cooled is at least partially immersed within the dielectric fluid. The cooling apparatus further includes a vapor condenser. The vapor condenser comprises a thermally conductive base structure and a plurality of thermally conductive condenser fins extending from the thermally conductive base structure into the sealed compartment in an upper portion of the sealed compartment. The plurality of thermally conductive condenser fins facilitate cooling of dielectric coolant vapor rising to the upper portion of the sealed compartment. At least one thermally conductive condenser fin of the plurality of thermally conductive condenser fins has a proximal end coupled to the thermally conductive base structure and a remote end remote from the thermally conductive base structure, and at least one exposed cavity therein extending from the remote end thereof towards the proximal end. The at least one exposed cavity is sized to provide a greater condenser fin surface area for facilitating vapor condensate formation on the at least one thermally conductive condenser fin, and thereby facilitate cooling of dielectric fluid vapor rising to the upper portion of the sealed compartment.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 6A depicts one example of a vapor condenser for, for example, the cooled electronic module of FIG. 5, in accordance with an aspect of the present invention;

FIG. 6B is a partially enlarged view of the vapor condenser of FIG. 6A, taken within line 6B thereof, in accordance with an aspect of the present invention;

FIG. 7A depicts an alternate embodiment of a vapor condenser for, for example, the cooled electronic module of FIG. 5, in accordance with an aspect of the present invention;

FIG. 7B is a partially enlarged view of the vapor condenser of FIG. 7A, taken within line 7B thereof, in accordance with an aspect of the present invention;

DETAILED DESCRIPTION OF THE INVENTION

Figure 1:
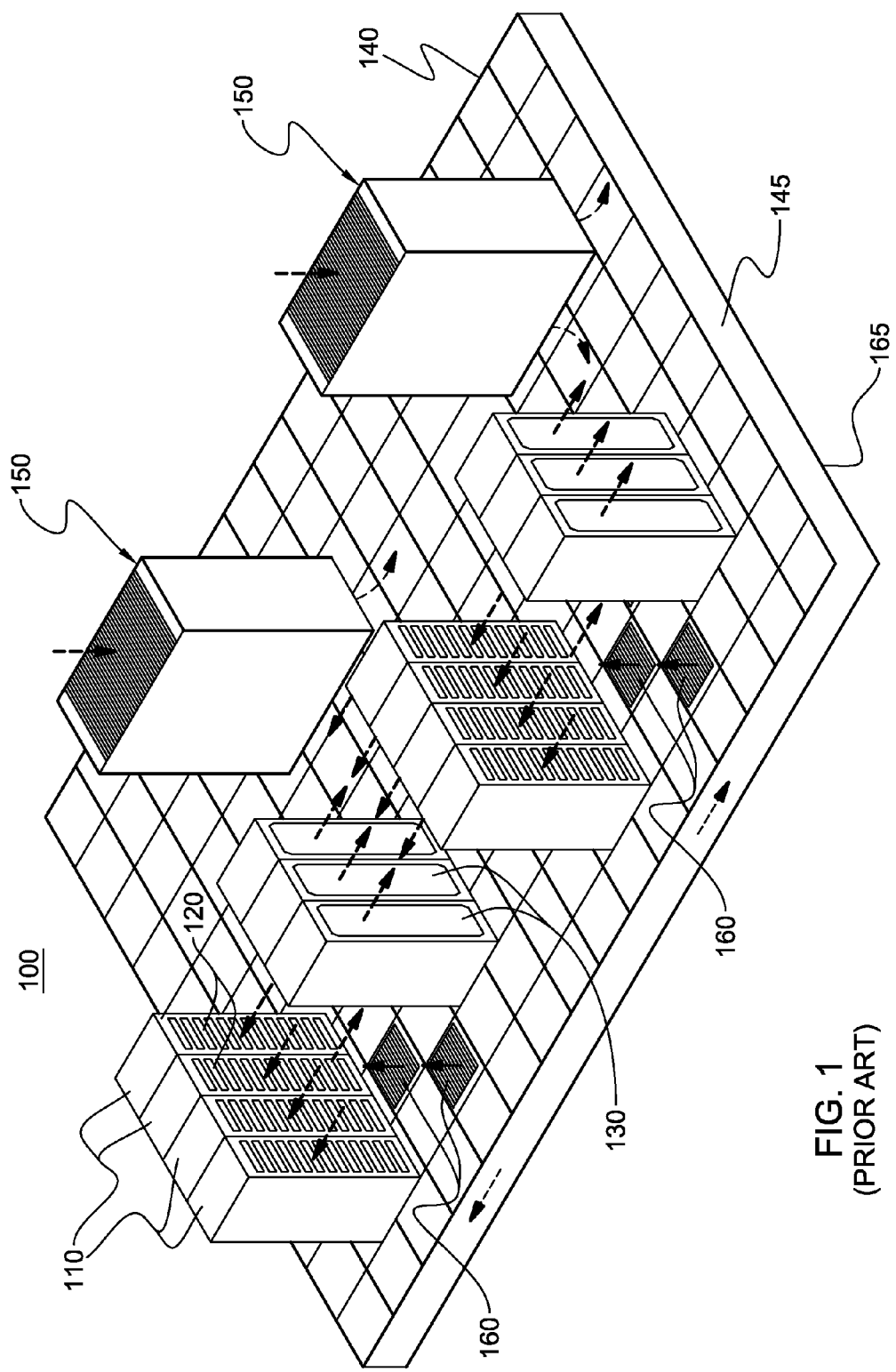
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system or electronic system, and may be, for example, a stand alone computer processor having high, mid or low end processing capability. In one embodiment, an electronics rack may comprise multiple electronic subsystems or drawers, each having one or more heat-generating components disposed therein requiring cooling. "Electronic subsystem" refers to any sub-housing, blade, book, drawer, node, compartment, etc., having one or more heat-generating electronic devices disposed therein. Each electronic subsystem of an electronics rack may be movable or fixed relative to the electronics rack, with the rack-mounted electronics drawers and blades of a blade center system being two examples of subsystems of an electronics rack to be cooled.

"Electronic device" refers to any heat-generating electronic device of, for example, a computer system or other electronics unit requiring cooling. By way of example, an electronic device may comprise one or more integrated circuit dies (or chips) and/or other electronic devices to be cooled, including one or more processor chips, memory chips and memory support chips. As a further example, the electronic device may comprise one or more bare dies or one or more packaged dies disposed on a common carrier. As used herein, "primary heat-generating component" refers to a primary heat-generating electronic device within an electronic subsystem, while "secondary heat-generating component" refers to an electronic device of the electronic subsystem generating less heat than the primary heat-generating component to be cooled. "Primary heat-generating die" refers, for example, to a primary heat-generating die or chip within a heat-generating electronic device comprising primary and secondary heat-generating dies (with a processor die being one example). "Secondary heat-generating die" refers to a die of a multi-die electronic device generating less heat than the primary heat-generating die thereof (with memory dies and memory support dies being examples of secondary dies to be cooled). As one example, a heat-generating electronic device could comprise multiple primary heat-generating bare dies and multiple secondary heat-generating dies on a common carrier. Further, the term "cold plate" refers to any thermally conductive structure having one or more channels or passageways formed therein for flowing of coolant therethrough. In addition, "metallurgically bonded" refers generally herein to two components being welded, brazed or soldered together by any means.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the cooling concepts disclosed herein are readily adapted to use with other types of coolant on the facility side and/or on the system side. For example, one or more of the coolants may comprise a brine, a fluorocarbon liquid, a hydrofluoroether liquid, a liquid metal, or other similar coolant, or refrigerant, while still maintaining the advantages and unique features of the present invention.

Reference is made below to the drawings, which are not drawn to scale to facilitate understanding thereof, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of the electronics racks 110.

Figure 2:
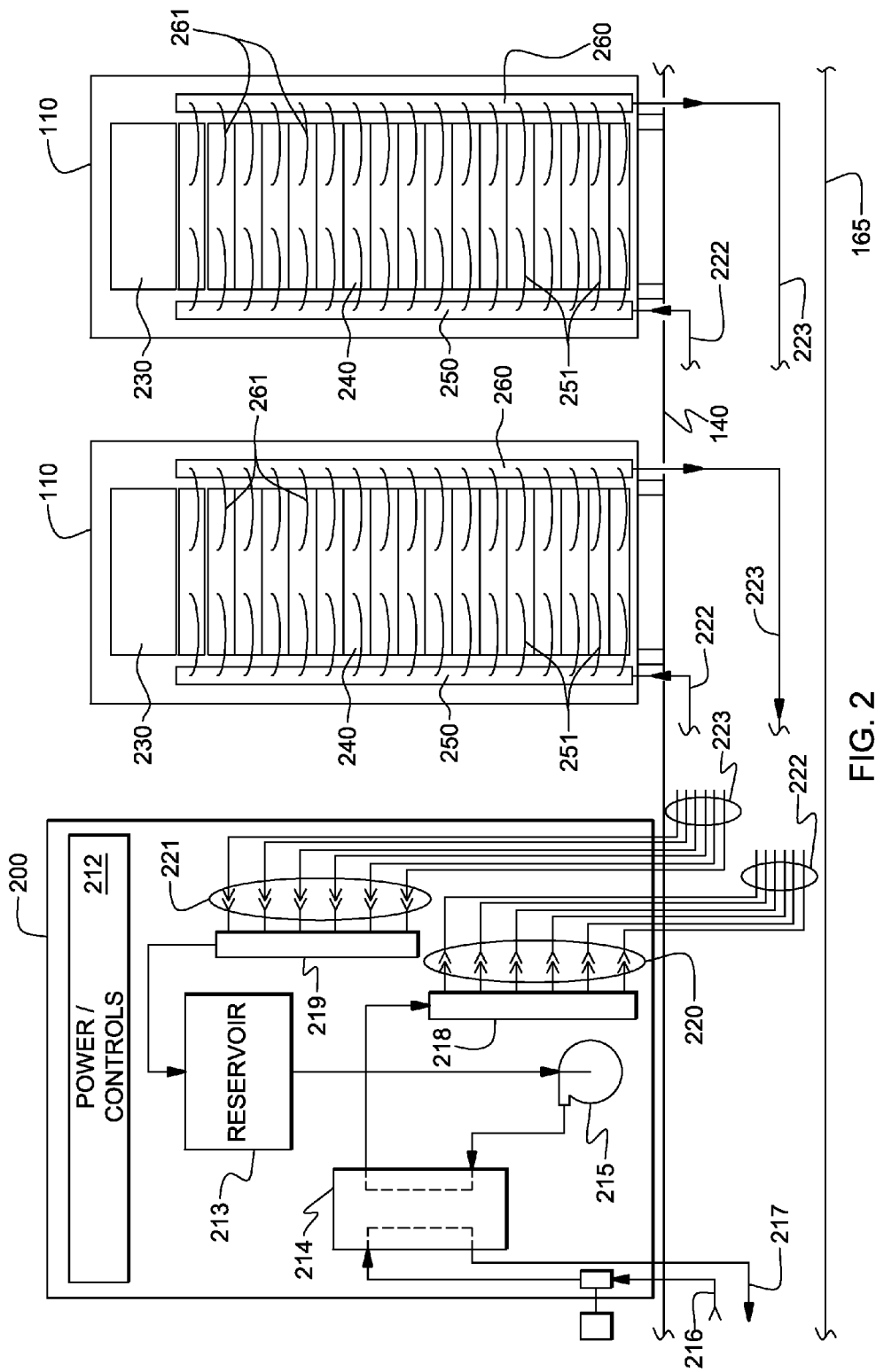
FIG. 2 depicts one embodiment of a coolant distribution unit for liquid-cooling of one or more electronics racks of a data center, in accordance with an aspect of the present invention.
Figure 3:
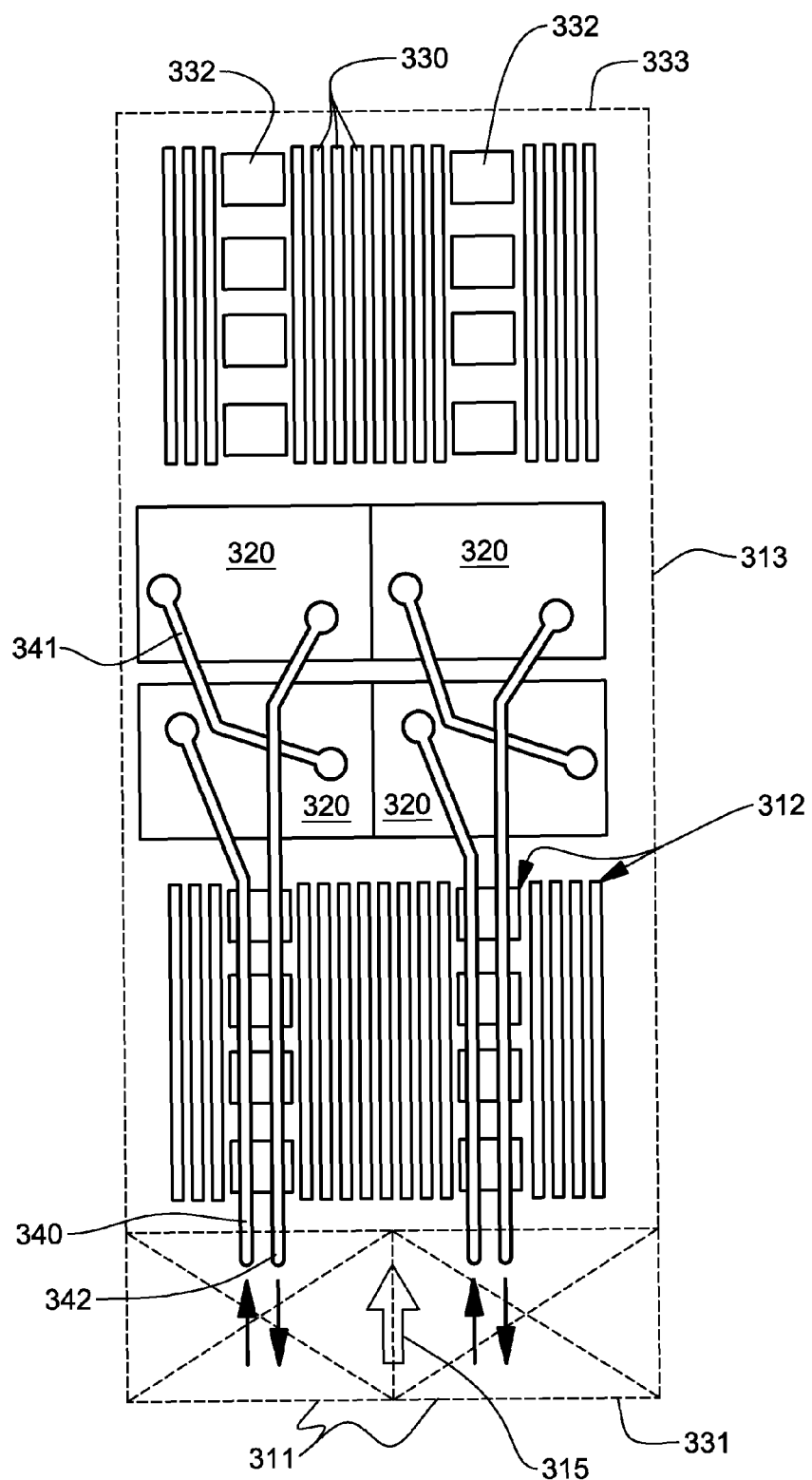
FIG. 3 is a plan view of one embodiment of an electronic subsystem layout illustrating an air and liquid cooling system for cooling components of the electronic subsystem, in accordance with an aspect of the present invention.
Figure 4:
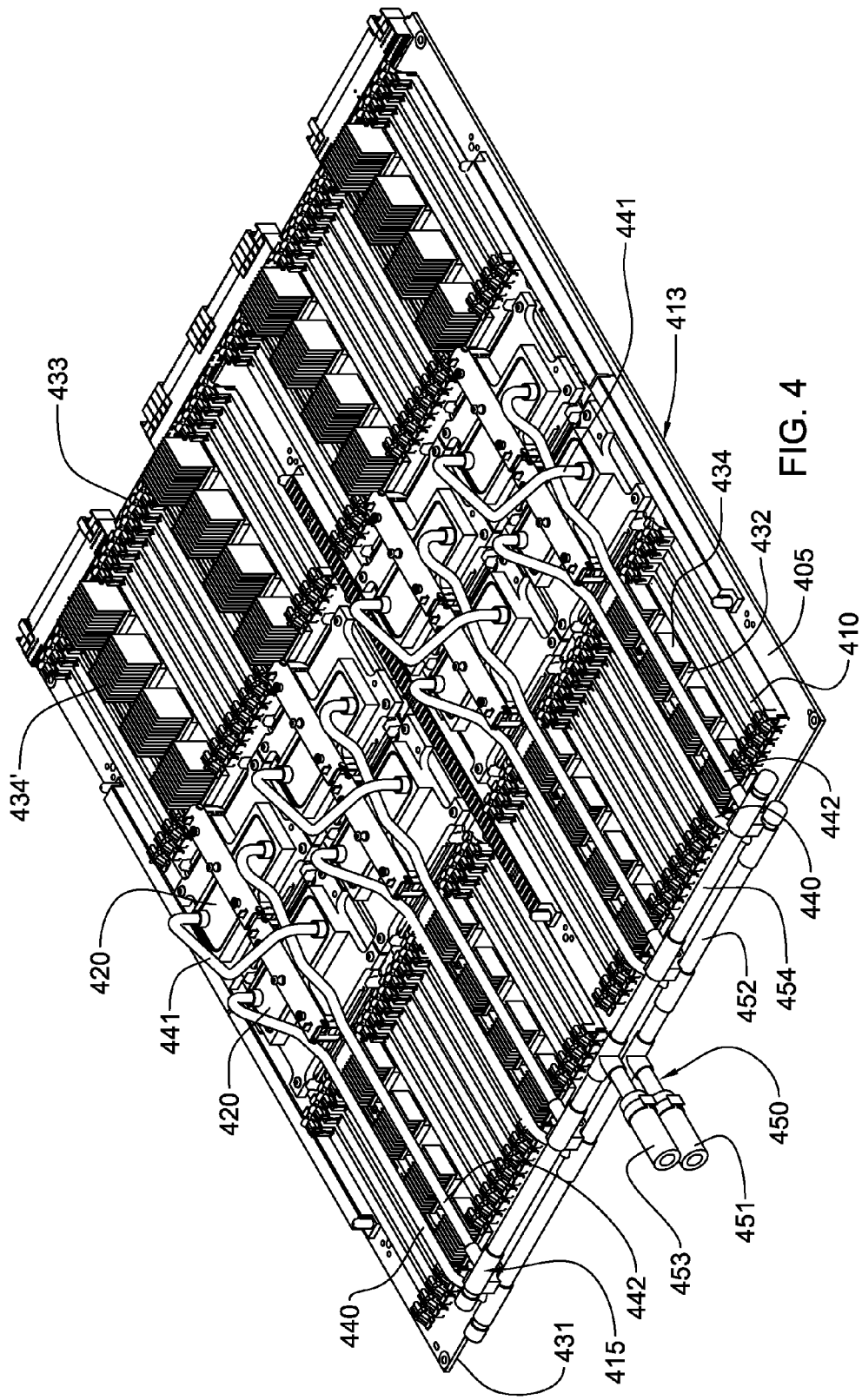
FIG. 4 depicts one detailed embodiment of a partially assembled electronic subsystem layout, wherein the electronic subsystem includes eight heat-generating electronic devices to be cooled, each having a respective cooling apparatus associated therewith, in accordance with an aspect of the present invention.

Due to the ever-increasing airflow requirements through electronics racks, and the limits of air distribution within the typical data center installation, liquid-based cooling is being combined with the conventional air-cooling. FIGS. 2-4 illustrate one embodiment of a data center implementation employing a liquid-based cooling system with one or more cold plates coupled to high heat-generating electronic devices disposed within the electronics racks.

FIG. 2 depicts one embodiment of a coolant distribution unit 200 for a data center. The coolant distribution unit is conventionally a large unit which occupies what would be considered a full electronics frame. Within coolant distribution unit 200 is a power/control element 212, a reservoir/expansion tank 213, a heat exchanger 214, a pump 215 (often accompanied by a redundant second pump), facility water inlet 216 and outlet 217 supply pipes, a supply manifold 218 supplying water or system coolant to the electronics racks 110 via couplings 220 and lines 222, and a return manifold 219 receiving water from the electronics racks 110, via lines 223 and couplings 221. Each electronics rack includes (in one example) a power/control unit 230 for the electronics rack, multiple electronic subsystems 240, a system coolant supply manifold 250, and a system coolant return manifold 260. As shown, each electronics rack 110 is disposed on raised floor 140 of the data center with lines 222 providing system coolant to system coolant supply manifolds 250 and lines 223 facilitating return of system coolant from system coolant return manifolds 260 being disposed in the supply air plenum beneath the raised floor.

In the embodiment illustrated, the system coolant supply manifold 250 provides system coolant to the cooling systems of the electronic subsystems (more particularly, to liquid-cooled cold plates thereof) via flexible hose connections 251, which are disposed between the supply manifold and the respective electronic subsystems within the rack. Similarly, system coolant return manifold 260 is coupled to the electronic subsystems via flexible hose connections 261. Quick connect couplings may be employed at the interface between flexible hoses 251, 261 and the individual electronic subsystems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger disposed at an air outlet side thereof, which also receives system coolant from the system coolant supply manifold 250 and returns system coolant to the system coolant return manifold 260.

FIG. 3 depicts one embodiment of an electronic subsystem 313 component layout wherein one or more air moving devices 311 provide forced air flow 315 to cool multiple components 312 within electronic subsystem 313. Cool air is taken in through a front 331 and exhausted out a back 333 of the subsystem. The multiple components to be cooled include multiple processor modules to which liquid-cooled cold plates 320 (of a liquid-based cooling system) are coupled, as well as multiple arrays of memory modules 330 (e.g., dual in-line memory modules (DIMMs)) and multiple rows of memory support modules 332 (e.g., DIMM control modules) to which air-cooled heat sinks are coupled. In the embodiment illustrated, memory modules 330 and the memory support modules 332 are partially arrayed near front 331 of electronic subsystem 313, and partially arrayed near back 333 of electronic subsystem 313. Also, in the embodiment of FIG. 3, memory modules 330 and the memory support modules 332 are cooled by air flow 315 across the electronic subsystem.

The illustrated liquid-based cooling system further includes multiple coolant-carrying tubes connected to and in fluid communication with liquid-cooled cold plates 320. The coolant-carrying tubes comprise sets of coolant-carrying tubes, with each set including (for example) a coolant supply tube 340, a bridge tube 341 and a coolant return tube 342. In this example, each set of tubes provides liquid coolant to a series-connected pair of cold plates 320 (coupled to a pair of processor modules). Coolant flows into a first cold plate of each pair via the coolant supply tube 340 and from the first cold plate to a second cold plate of the pair via bridge tube or line 341, which may or may not be thermally conductive. From the second cold plate of the pair, coolant is returned through the respective coolant return tube 342.

FIG. 4 depicts in greater detail an alternate electronic subsystem layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is cooled and conditioned water.

FIG. 4 is an isometric view of one embodiment of an electronic subsystem or drawer, and monolithic cooling system. The depicted planar server assembly includes a multi-layer printed circuit board to which memory DIMM sockets and various electronic devices to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to facilitate cooling one or more electronic devices to which the cold plates are mechanically and thermally coupled. The number of parallel paths and the number of series-connected liquid-cooled cold plates depends, for example, on the desired device temperature, available coolant temperature and coolant flow rate, and the total heat load being dissipated from each electronic device.

More particularly, FIG. 4 depicts a partially assembled electronic subsystem 413 and an assembled liquid-based cooling system 415 coupled to primary heat-generating components (e.g., including processor dies) to be cooled. In this embodiment, the electronics system is configured for (or as) an electronics drawer of an electronics rack, and includes, by way of example, a support substrate or planar board 405, a plurality of memory module sockets 410 (with the memory modules (e.g., dual in-line memory modules) not shown), multiple rows of memory support modules 432 (each having coupled thereto an air-cooled heat sink 434), and multiple processor modules (not shown) disposed below the liquid-cooled cold plates 420 of the liquid-based cooling system 415.

In addition to liquid-cooled cold plates 420, liquid-based cooling system 415 includes multiple coolant-carrying tubes, including coolant supply tubes 440 and coolant return tubes 442 in fluid communication with respective liquid-cooled cold plates 420. The coolant-carrying tubes 440, 442 are also connected to a header (or manifold) subassembly 450 which facilitates distribution of liquid coolant to the coolant supply tubes and return of liquid coolant from the coolant return tubes 442. In this embodiment, the air-cooled heat sinks 434 coupled to memory support modules 432 closer to front 431 of electronic subsystem 413 are shorter in height than the air-cooled heat sinks 434' coupled to memory support modules 432 near back 433 of electronic subsystem 413. This size difference is to accommodate the coolant-carrying tubes 440, 442 since, in this embodiment, the header subassembly 450 is at the front 431 of the electronics drawer and the multiple liquid-cooled cold plates 420 are in the middle of the drawer.

Liquid-based cooling system 415 comprises a pre-configured monolithic structure which includes multiple (pre-assembled) liquid-cooled cold plates 420 configured and disposed in spaced relation to engage respective heat-generating electronic devices. Each liquid-cooled cold plate 420 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 420 to the associated electronic device to form the cold plate and electronic device assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 4, header subassembly 450 includes two liquid manifolds, i.e., a coolant supply header 452 and a coolant return header 454, which in one embodiment, are coupled together via supporting brackets. In the monolithic cooling structure of FIG. 4, the coolant supply header 452 is metallurgically bonded in fluid communication to each coolant supply tube 440, while the coolant return header 454 is metallurgically bonded in fluid communication to each coolant return tube 452. A single coolant inlet 451 and a single coolant outlet 453 extend from the header subassembly for coupling to the electronics rack's coolant supply and return manifolds (not shown).

FIG. 4 also depicts one embodiment of the pre-configured, coolant-carrying tubes. In addition to coolant supply tubes 440 and coolant return tubes 442, bridge tubes or lines 441 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 440, bridge tubes 441 and coolant return tubes 442 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

Figure 5:
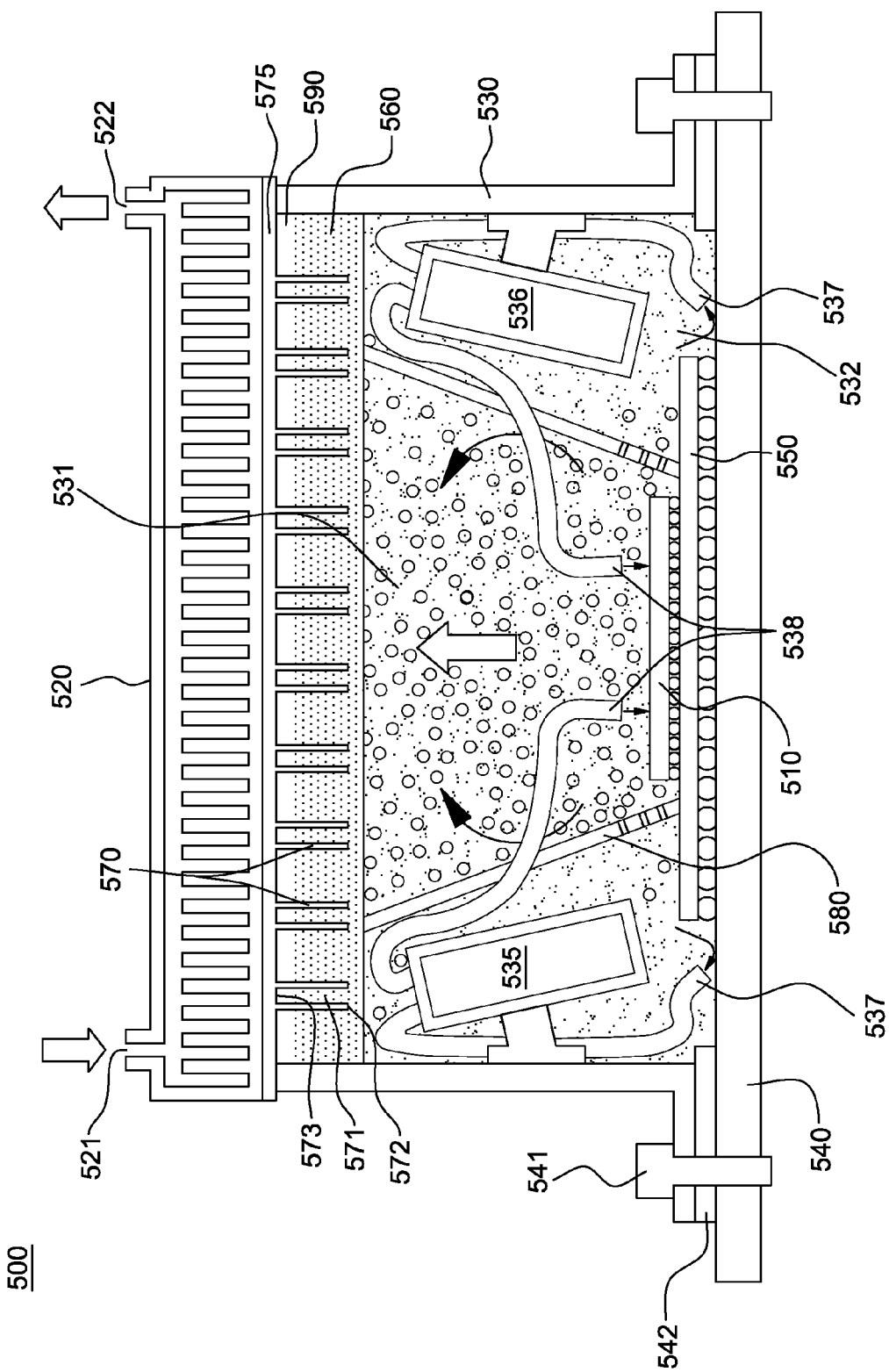
FIG. 5 is a cross-sectional elevational view of one embodiment of a cooled electronic module, in accordance with an aspect of the present invention.

FIG. 5 depicts one embodiment of a pump-enhanced, immersion cooled electronic module 500, which is a structural and thermal interface between a heat-generating electronic device 510, such as a processor or other integrated circuit die, and a liquid-cooled cold plate 520, such as the above-described liquid-cooled cold plate 420 of the electronic subsystem of FIG. 4. Cooled electronic module 500 includes a module casing 530 which forms part of a housing, configured to at least partially surround and form a sealed, fluid-tight compartment 531 about electronic device 510 to be cooled. As shown, dielectric coolant 532 is disposed within sealed compartment 531, as are two impingement-cooling, immersed pumps 535, 536. Each impingement-cooling, immersed pump 535, 536 includes an inlet pump tube 537 disposed with an inlet in a lower portion of the sealed compartment for drawing liquid dielectric fluid into the pump, and a respective pump jet nozzle 538 for directing pressurized dielectric fluid towards the electronic device to be cooled to facilitate the cooling thereof. By way of specific example, the impingement-cooling, immersed pumps may each be an LPD-125 liquid pump offered by AdaptivEnergy, LLC, of Hampton, Va., USA.

The housing is a shell-like component that is attached to, for example, a printed circuit board 540 using bolts or screws 541 and a sealing gasket (or o-ring) 542, which is compressed between a lower surface of the housing and an upper surface of the board, or alternatively, between a lower surface of the housing and an upper surface of a substrate 550 to which the electronic device 510 directly couples. As shown, multiple electrical connections, such as controlled collapse chip connections (C4) connections, electrically couple the electronic device to substrate 550, which in this embodiment is itself electrically coupled via another set of electrical connections to printed circuit board 540.

As used herein, the word "substrate" refers to any underlying supporting structure, such as substrate 550 or printed circuit board 540 to which the electronic device is coupled, and to which the housing may be sealed in order to form sealed compartment 531 about the electronic device. Sealing gasket 542 seals off the inner compartment of the housing and assists in retaining the dielectric fluid within the sealed compartment. The two impingement-cooling, immersed pumps 535, 536 are, in this embodiment, mechanically coupled to opposing side walls of the housing, and are positioned, sized and configured to force pressurized dielectric coolant towards the heat-generating electronic device to be cooled, such as a back surface of the heat-generating electronic device. This is accomplished (in one embodiment) via dual, freestanding jet nozzles 538 positioned directly over the back surface of the electronic device to be cooled. When in operation, as dielectric fluid absorbs heat, it boils undergoing a phase change from liquid phase to vapor phase, and thus its latent heat of vaporization is utilized for cooling purposes. The resultant dielectric fluid vapor rises to the upper portion of the sealed compartment and forms a dielectric vapor layer 560 in the upper portion of the sealed compartment. Vapor rises since it possesses a significantly lower density compared with the surrounding dielectric liquid. A submerged baffle (or vapor barrier) 580 facilitates directing dielectric fluid vapor upwards to the upper portion of the sealed compartment. At the upper most portion of the sealed compartment, there is illustrated a thin, non-condensable gas layer 590 comprising gases, such as air, which have also left the liquid and travel upwards. These gases can reside in solution within the dielectric fluid, but once out-gassed through the boiling process, cannot be returned to solution via a coolant condensation process.

As depicted, cooled electronic module 500 further comprises a plurality of thermally conductive condenser fins 570 extending into the sealed compartment from a top wall (i.e., a thermally conductive base structure 575) of the housing. In one embodiment, these condenser fins are appropriately sized to accommodate the anticipated dielectric vapor layer 560 to form in the upper portion of the sealed compartment with operation of the heat-generating electronic device. Upon reaching the upper portion of the sealed compartment, the dielectric fluid vapor contacts the cool surfaces of the condenser fins, which are cooled, for example, by means of a thermal conduction coupling to liquid-cooled cold plate 520, and more particularly, to system coolant passing via inlet 521 and outlet 522 through the liquid-cooled cold plate. By making contact with the cool, vertically-oriented condenser fin surfaces, the dielectric fluid vapor undergoes a second phase change process, condensing from vapor to liquid state, and the liquid droplets fall back downward due to gravity and their relatively higher density compared with the neighboring vapor region. By way of example, the vertically-oriented condenser fins might comprise pin fin or plate fin structures. In the embodiment illustrated in FIG. 5, the plurality of thermally conductive condenser fins 570 each comprise a cavity 571 disposed therein extending from a remote end 572, remote from the thermally conductive base structure 575, to a proximal end 573 thereof adjacent to the thermally conductive base structure. The exposed cavities are sized so that this configuration advantageously increases condensation heat transfer surface area of the condenser fins.

Continuing with FIG. 5, dielectric liquid in the lower portion of the sealed compartment is simultaneously being drawn into the low pressure side of the immersed pumps 535, 536 via the inlet pump tubing 537. Note that the submerged baffle is configured to function to partially isolate the vapor rich region near the electronic device from the liquid (condensate) rich region near the pump inlet tube openings. The baffle 580 may include openings in its lower portion to allow the dielectric fluid to find its own common level within the sealed compartment. As long as the boiling and condensation cooling processes are in equilibrium and are commensurate with heat generated by the electronic device to be cooled, the electronic module will successfully transport heat from the electronic device to the cold plate, maintaining steady state temperatures throughout.

The coolant employed within the dielectric module is a dielectric fluid so as not to cause a short circuit of electrical current on the various exposed parts of the electronic device and substrate. Many dielectric fluids are commercially available and may be used in the cooled electronic module configuration described herein. Examples include the Novec fluids, manufactured by 3M Corporation (e.g., FC-72, FC-86, HFE-7000 and HFE-7200). Those skilled in the art should note that in addition to the cooling taking place from the electronic device due to the impinging dielectric fluid, there is also heat transfer occurring from the substrate and any other component within the enclosure which generates heat. It should also be noted that the cooled electronic module embodiment of FIG. 5 employs two immersed pumps for redundancy, in the event of a single pump failure. Other configurations may employ only one pump, or even more than two pumps if desired.

Further details and variations on a pump-enhanced, immersion-cooled electronic module such as depicted in FIG. 5 are disclosed in co-filed U.S. patent application Ser. No. 12/491, 281, entitled "Cooled Electronic Module with Pump-Enhanced, Dielectric Fluid-Immersion Cooling", and co-filed U.S. patent application Ser. No. 12/491,286, entitled "Condenser Fin Structures Facilitating Vapor Condensation Cooling of Coolant", and co-filed U.S. patent application Ser. No. 12/491,289, entitled "Direct Jet Impingement-Assisted Thermosyphon Cooling Apparatus and Method", and co-filed U.S. patent application Ser. No. 12/491,293, entitled "Condenser Block Structures with Cavities Facilitating Vapor Condensation Cooling of Coolant", the entirety of each of which is hereby incorporated herein by reference.

FIGS. 6A & 6B depict one embodiment of a vapor condenser 600 for a cooled electronic module, such as a module of the type depicted in FIG. 5. As illustrated, vapor condenser 600 includes a thermally conductive base structure 610 having a plurality of thermally conductive condenser fins 620 extending therefrom. In the illustrated embodiment, the plurality of thermally conductive condenser fins are a plurality of cylindrical-shaped pin-fins, and as shown, the condenser fins are configured to extend vertically in a direction parallel with gravity, with each having a uniform cross-sectional area along its length. Each condenser fin thus possesses a cylindrical outer surface on which vapor condenses and flows downward. A disadvantage of this configuration is the relatively low value for certain metrics, such as the ratio of convective area to fin material volume, and the ratio of convective area to fin height. For a solid pin-fin that is 2 mm in diameter and 5 mm in height, these ratios are 2.2 mm$^{-1}$ and 6.9 mm, respectively, both of which should be improved to facilitate the design of a compact, low fin volume condenser structure.

FIGS. 7A & 7B depict an alternate embodiment of a vapor condenser 700, in accordance with an aspect of the present invention. In this embodiment, vapor condenser 700 comprises a thermally conductive base structure 710 and a plurality of thermally conductive condenser fins 720 extending therefrom. As illustrated in FIG. 7B, each condenser fin of the plurality of thermally conductive condenser fins includes a cavity 730 extending from the remote end thereof into the condenser fin. These cavities result in hollowed pin-fin structures, which are vertically oriented as illustrated to align with gravity, and which provide condensation heat transfer areas on two external vapor-exposed fin surfaces, one on the outer surface of the condenser fin, and one on the exposed inner surface of the condenser fin. For a thermally conductive condenser fin having an outside diameter of 2 mm, an inside diameter of 1 mm, and a height of 5 mm, the ratio of convective area to fin volume and the ratio of convective area to fin height are 4.2 mm$^{-1}$ and 9.9 mm, respectively. These metrics, which characterize an enhanced ability to design a compact vapor condenser, are superior by a factor of 1.4-1.9 to the same metrics noted above for the condenser design illustrated in FIGS. 6A & 6B.

Figure 8A:
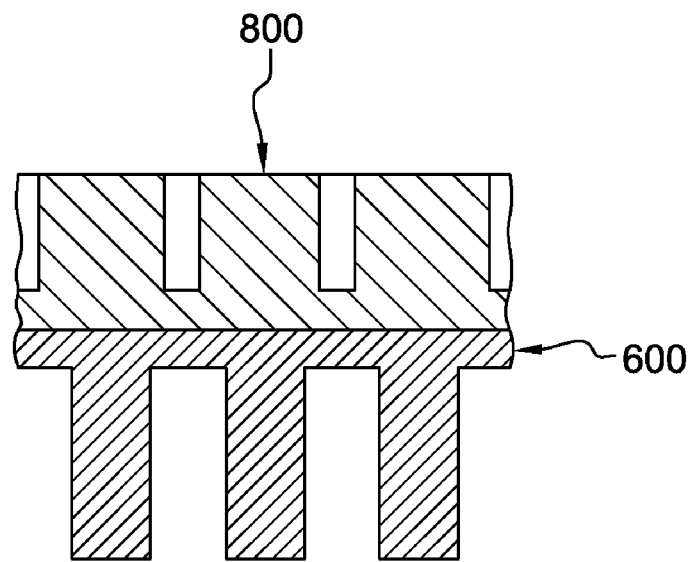
FIG. 8A is a partial cross-sectional elevational depiction of the vapor condenser of FIG. 6A, coupled to a cold plate block, in accordance with an aspect of the present invention.
Figure 8B:
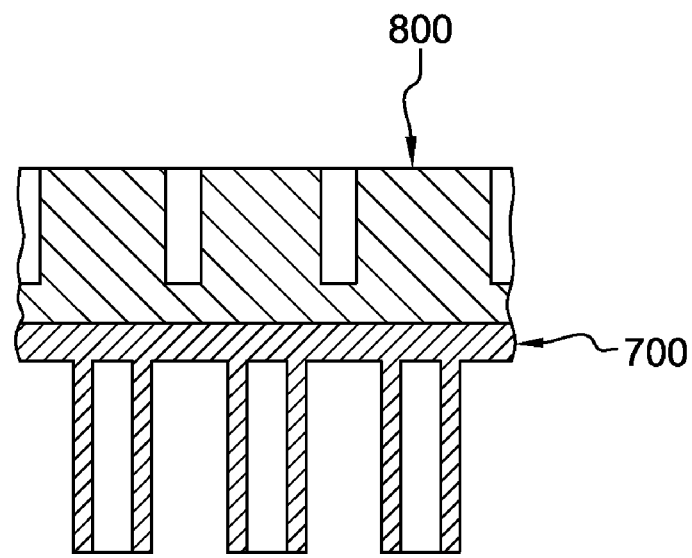
FIG. 8B is a partial cross-sectional elevational depiction of the vapor condenser of FIG. 7A, coupled to a cold plate block, in accordance with an aspect of the present invention.

FIG. 8A is a partial cross-sectional elevational depiction of a cold plate block 800 stacked on top of the vapor condenser 600 of FIG. 6A, and FIG. 8B is a partial cross-sectional elevational depiction of cold plate block 800 stacked on top of vapor condenser 700 of FIG. 7A. To verify the advantages of the cavities illustrated in FIGS. 7A & 7B, thermal modeling was performed analyzing the two structures depicted in FIGS. 8A & 8B. A numerical cell of 9 mm×3 mm footprint was used to represent a larger condenser that is 90 mm×90 mm. The condenser material was assumed to be aluminum and the dielectric coolant was assumed to be HFE-7000, which is a coolant manufactured by 3M Corporation. For both vapor condenser configurations, the outside pin diameter was assumed to be 2 mm and the pin-fin height 5 mm. For the hollow condenser fin depicted in FIG. 8B, the inside diameter was assumed to be 1 mm. The secondary coolant utilized in the thermal modeling was chosen to be water flowing through a copper cold plate block with several 0.5 mm×2 mm flow channels. The water flow rate was assumed to be 0.25 GPM for the 90 mm×90 mm condenser, and it was supplied at 18° C. Well-known correlations from literature were utilized to calculate the local fin heat transfer coefficient along the length of the pin-fins in the two embodiments. Specifically, calculations were carried out for vertically downward-facing surfaces immersed in a vapor of HFE-7000 dielectric coolant. The calculations used correlations known in the art which allow for the estimation of condensation film thickness growth on vertical surfaces. Specific equations used were from Rohsenow and Choi, Prentice Hall Publications (1961) and utilized the coolant properties, the temperature difference between the solid surface and the saturated coolant vapor, and the vertical distance from the point of inception of condensation as input parameters to calculate the condensate film thickness and local heat transfer coefficient. The saturated vapor temperature and atmospheric conditions for this coolant (i.e., HFE-7000) is 34° C., and the temperature difference between the vertical surface and the surrounding vapor was assumed to be 14° C.

Figure 9:
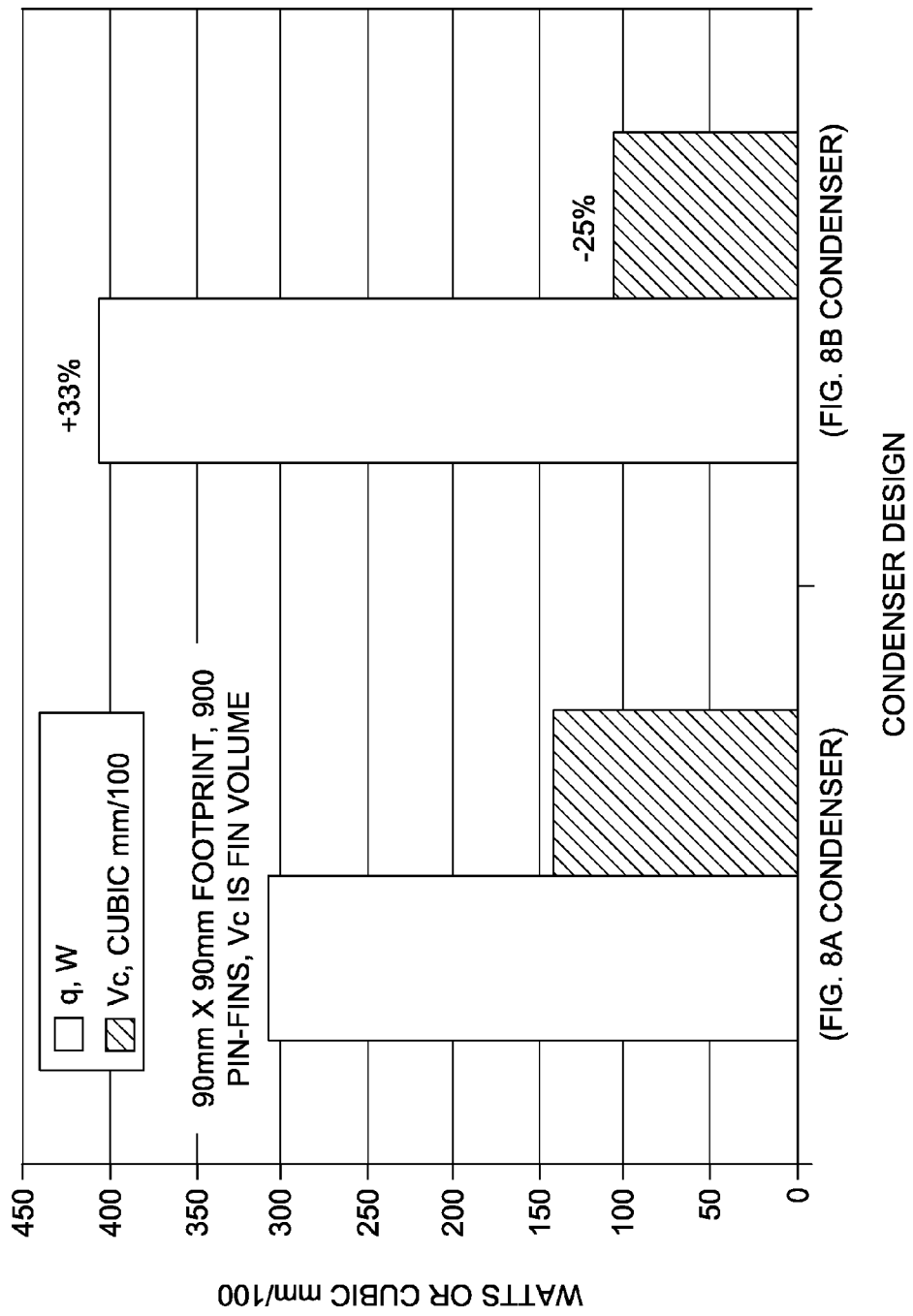
FIG. 9 is a graph depicting thermal modeling results comparing heat transfer and consumed volume of the vapor condenser structure of FIG. 8A versus the vapor condenser structure of FIG. 8B, in accordance with an aspect of the present invention.

FIG. 9 graphically depicts the results of the thermal modeling analysis for the structures depicted in FIGS. 8A & 8B, and described above. For the structure of FIG. 8A, the total fin material volume was 14.1 cc, and the heat dissipation rate was calculated to be 306 W for the 90 mm×90 mm module outlined. For the structure of FIG. 8B, the total fin material volume was 10.6 cc, and the heat dissipation rate was calculated to be 406 W. Thus, the use of the structure depicted in FIG. 8B over the structure of FIG. 8A results in a thermal performance enhancement of 33%, while utilizing 25% less fin mass.

Figure 10B:
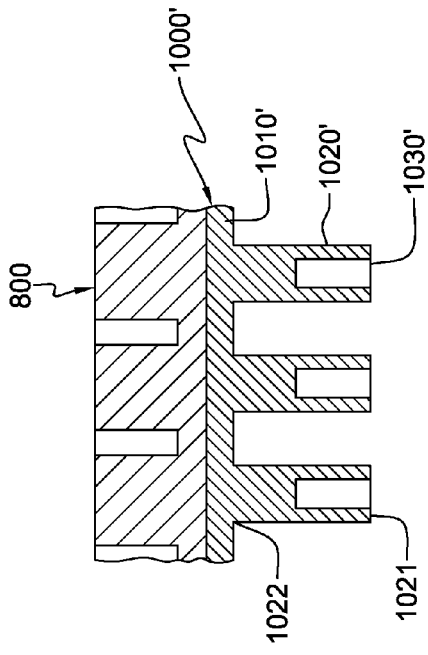
FIGS. 10A-10C depict partial cross-sectional elevational views of additional alternate embodiments of a vapor condenser and cold plate assembly, in accordance with an aspect of the present invention.
Figure 10C:
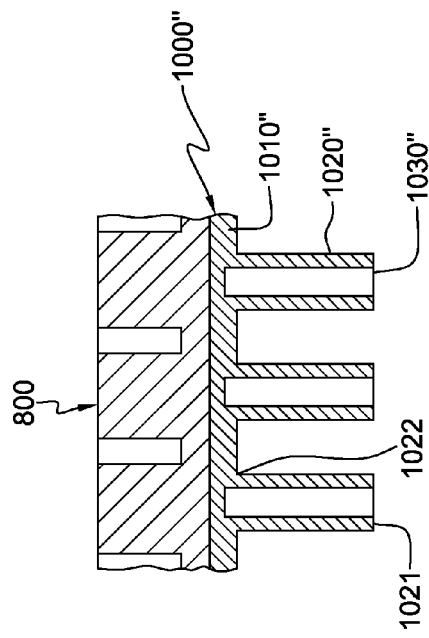
Figure 10A:
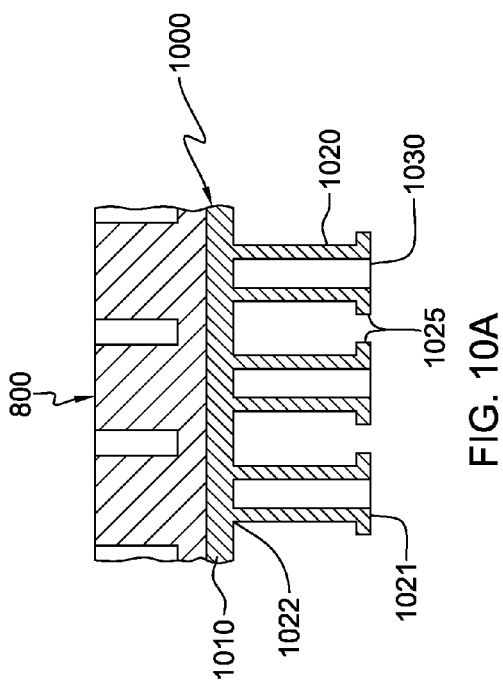

FIGS. 10A-10C illustrate three alternate assembly embodiments for a cold plate block in combination with a vapor condenser, such as described herein. In FIG. 10A, cold plate block 800 resides atop a vapor condenser 1000 comprising thermally conductive base structure 1010, which has depending downward therefrom a plurality of thermally conductive condenser fins 1020. Each thermally conductive condenser fin 1020 has a remote end 1021, remote from the thermally conductive base structure, and a proximal end 1022 adjacent to the thermally conductive base structure. An exposed cavity 1030 projects inward from the remote end 1021 of each thermally conductive condenser fin 1020. In this embodiment, the cavities 1030 extend to the proximal end of the thermally conductive condenser fin. Additionally, in the embodiment illustrated in FIG. 10A, the plurality of thermally conductive condenser fins include a lip (or a rim) 1025 at the remote ends thereof. This lip 1025 is configured and sized to act as an isolation structure that directs condensate film on the outer surface of the condenser fin away from condensate film on the inner surface of the hollowed condenser fin (i.e., the surface of the fin defining cavity 1030). Lip 1025 is provided to ensure that the cavity is not clogged with a liquid droplet accumulating on the outer surface of the condenser fin when vapor condenser 1000 is facilitating coolant vapor condensate formation.

In the embodiment of FIG. 10B, cold plate block 800 is coupled to a vapor condenser 1000' comprising a thermally conductive base structure 1010' having a plurality of thermally conductive condenser fins 1020' extending therefrom. Each condenser fin 1020' includes a remote end 1021 and a proximal end 1022. Within each thermally conductive condenser fin, a cavity 1030' (or opening) is formed from the remote end thereof into the condenser fin. The result is a partially hollowed pin-fin in which the cavity is only partially sunk into the fin. This design would be useful for cases where the entire internal surface area is not required, or for designs where the manufacturing process can only produce a cavity of a limited depth.

FIG. 10C illustrates another embodiment of an assembly comprising cold plate block 800 and a vapor condenser 1000", in accordance with an aspect of the present invention. In this embodiment, vapor condenser 1000" includes a thermally conductive base structure 1010" having a plurality of thermally conductive condenser fins 1020" extending therefrom. Each condenser fin has a proximal end 1022 disposed adjacent to the thermally conductive base structure, and a remote end 1021 remote from the thermally conductive base structure. A cavity 1030" is provided within each condenser fin extending from the remote end thereof through the condenser fin and partially into the thermally conductive base structure 1010". This design may be useful for implementations where the thermally conductive base structure is sufficiently thick and the manufacturing process allows for cavities of large relative depth to be established. The advantage is a further increased condensation surface area, as well as a reduction in the volume mass of the vapor condenser.

Figure 11B:
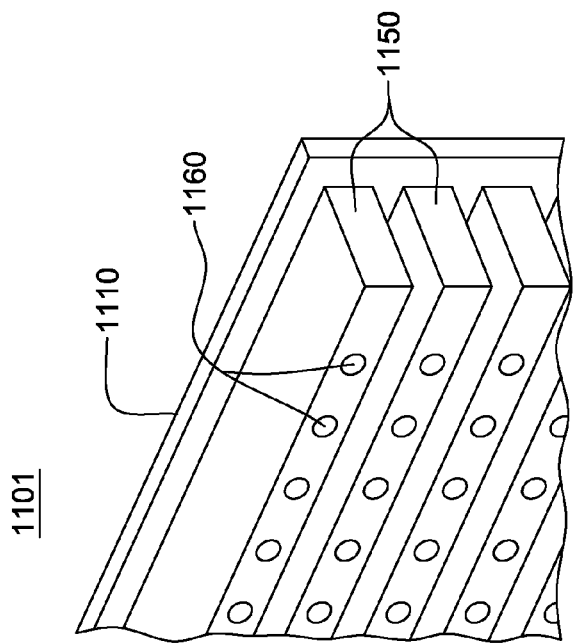
FIG. 11B is a partial isometric view of another embodiment of vapor condenser comprising a plurality of thermally conductive plate fins, each with multiple cavities formed therein to facilitate vapor condensate formation, in accordance with an aspect of the present invention.
Figure 11A:
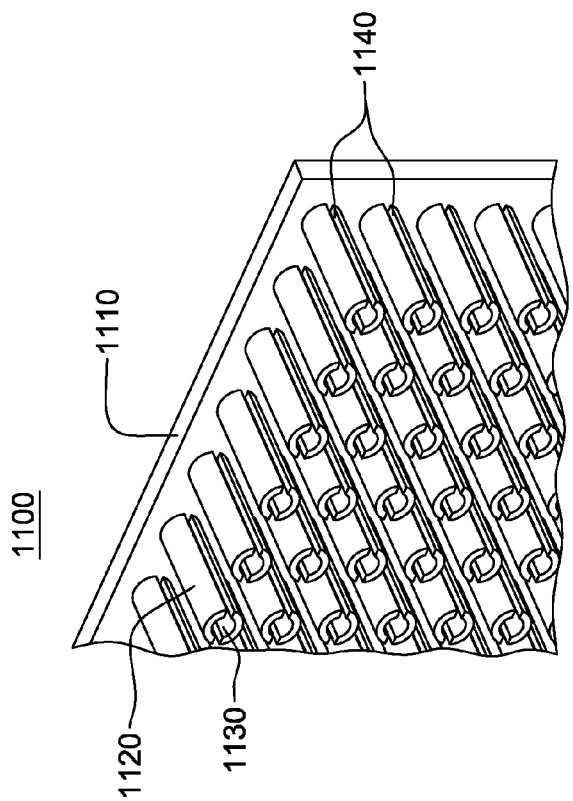
FIG. 11A is a partial isometric view of one embodiment of a vapor condenser such as depicted in FIGS. 7A & 7B, modified with vapor drainage side slots, in accordance with an aspect of the present invention.

FIGS. 11A & 11B depict two further variations on a vapor condenser structure, in accordance with an aspect of the present invention. In FIG. 11A, a vapor condenser 1100 is illustrated wherein a thermally conductive base structure 1110 is provided having a plurality of thermally conductive condenser fins 1120 extending therefrom. As illustrated, the condenser fins are assumed to extend in a direction aligned with gravity. Each condenser fin includes an exposed cavity 1130 extending from the remote end thereof into the condenser fin, for example, to the thermally conductive base structure 1110. The vapor condenser further includes vapor drainage side slots 1140 extending from the exterior surface of each thermally conductive condenser fin to the cavity formed therein. In the illustrated embodiment, these vapor drainage slots 1140 are positioned 180 degrees apart in each condenser fin. Advantageously, in cases where the vapor region of a cooled electronic module might need to be evacuated using a port located at the top of the module, a design such as illustrated in FIG. 11A can be employed to allow access to the gaseous region at the base of the inside of the condenser fins. This design also allows for module designs in which there is a vapor flow across the fins.

FIG. 11B depicts another variation of a vapor condenser, generally denoted 1101, in accordance with an aspect of the present invention. Vapor condenser 1101 includes a thermally conductive base structure 1110, as well as a plurality of thermally conductive plate fins 1150 extending therefrom in a direction parallel with gravity. In this embodiment, multiple cavities 1160 are provided, such as exposed pin holes extending from the remote ends of the plurality of thermally conductive plate fins towards the proximal ends thereof. Cavities 1160 can be formed as cylindrical holes sunk into the plate fin material. Advantageously, this configuration improves a plate fin condenser by simultaneously expanding the condenser surface area and reducing the mass of the structure.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:
1. A cooling apparatus comprising:
  a housing configured to at least partially surround and form a sealed compartment about an electronic device to be cooled;
  a dielectric fluid disposed within the sealed compartment, wherein the electronic device to be cooled is at least partially immersed within the dielectric fluid;

at least one pump disposed within the sealed compartment for actively pumping the dielectric fluid disposed within the sealed compartment towards the electronic device to be cooled, the at least one pump comprising an impingement-cooling, immersed pump disposed within the sealed compartment, the impingement-cooling, immersed pump actively pumping the dielectric fluid drawn via an inlet from a lower region of the sealed compartment towards the electronic device to be cooled;

an at least partially submerged baffle disposed adjacent to at least one side of the electronic device to be cooled to facilitate directing of dielectric fluid vapor to an upper region of the sealed compartment, and away from the dielectric fluid in the lower region of the sealed compartment being drawn into the impingement-cooling, immersed pump for active pumping via an outlet towards the electronic device to be cooled, wherein the inlet and the outlet of the impingement-cooling, immersed pump are disposed on different sides of the at least partially submerged baffle; and a vapor condenser extending into the sealed compartment in the upper region of the sealed compartment, the vapor condenser comprising:

a thermally conductive base structure; and at least one thermally conductive condenser fin extending from the thermally conductive base structure, wherein the at least one thermally conductive condenser fin has a proximal end coupled to the thermally conductive base structure and a remote end remote from the thermally conductive base structure, and wherein the at least one thermally conductive condenser fin comprises at least one exposed cavity therein extending from the remote end thereof towards the proximal end, the at least one exposed cavity being sized to provide a greater condenser fin surface area for facilitating coolant vapor condensate formation on the at least one thermally conductive condenser fin.

2. The cooling apparatus of claim 1, wherein the at least one exposed cavity extends only partially into the at least one thermally conductive condenser fin from the remote end thereof.

3. The cooling apparatus of claim 1, wherein the at least one exposed cavity extends fully through the at least one thermally conductive condenser fin from the remote end to the proximal end thereof, and partially into the thermally conductive base structure to define a greater condenser surface area for facilitating the coolant vapor condensate formation.

4. The cooling apparatus of claim 1, further comprising a lip on an outer surface of the at least one thermally conductive condenser fin at the remote end thereof, the lip being sized and configured to direct the coolant vapor condensate formation forming on the outer surface of the at least one thermally conductive condenser fin away from the coolant vapor condensate formation forming on an inner surface of the at least one thermally conductive condenser fin defining the at least one exposed cavity.

5. The cooling apparatus of claim 1, wherein the at least one thermally conductive condenser fin comprises at least one thermally conductive plate fin, the at least one exposed cavity of the at least one thermally conductive plate fin comprising multiple exposed cavities therein extending from the remote end of the at least one thermally conductive plate fin towards the proximal end thereof, the multiple exposed cavities being sized to increase condenser surface area for facilitating the coolant vapor condensate formation on the at least one thermally conductive plate fin.

6. The cooling apparatus of claim 1, further comprising at least one side slot formed in the at least one thermally conductive condenser fin extending from an outer surface thereof to the at least one exposed cavity in the at least one thermally conductive condenser fin, the at least one side slot being configured to facilitate vapor venting from the at least one exposed cavity.

7. The cooling apparatus of claim 6, wherein the at least one exposed cavity extends from the remote end to the proximal end of the at least one thermally conductive condenser fin, and the at least one side slot further comprises a first side slot and a second side slot, each of the first and second side slots extending from the remote end to the proximate end of the at least one thermally conductive condenser fin and extending from the outer surface thereof to the at least one exposed cavity to facilitate the vapor venting from the at least one exposed cavity.

8. The cooling apparatus of claim 1, wherein the at least one thermally conductive condenser fin further comprises a plurality of a thermally conductive condenser fins extending from the thermally conductive base structure, wherein an outer perimeter of each thermally conductive condenser fin of the plurality of thermally conductive condenser fins are one of rectangular-shaped, square-shaped or circular-shaped, and the each thermally conductive condenser fin of the plurality of thermally conductive condenser fins comprises an exposed cavity of the at least one exposed cavity therein extending from the remote end thereof towards the proximal end, the exposed cavity being sized to provide the greater condenser fin surface area for facilitating the coolant vapor condensate formation on the each thermally conductive condenser fin.

9. The cooling apparatus of claim 8, wherein the exposed cavity in each thermally conductive condenser fin of the plurality of thermally conductive condenser fins is cylindrical-shaped.

10. The cooling apparatus of claim 9, farther comprising at least one side slot formed in each thermally conductive condenser fin of the plurality of thermally conductive condenser fins, each side slot of the at least one side slot formed in the each thermally conductive condenser fin extending from an outer surface thereof to the exposed cavity therein, the at least one side slot being configured to facilitate vapor venting from the exposed cavity.

* * * * *